(12) United States Patent
Na

(10) Patent No.: US 11,652,186 B2
(45) Date of Patent: May 16, 2023

(54) AVALANCHE PHOTO-TRANSISTOR

(71) Applicant: Artilux, Inc., Menlo Park, CA (US)

(72) Inventor: Yun-Chung Na, San Jose, CA (US)

(73) Assignee: Artilux, Inc., Menlo Park, CA (US)

( * ) Notice: Subject to any disclaimer, the term of this patent is extended or adjusted under 35 U.S.C. 154(b) by 210 days.

(21) Appl. No.: 17/085,232

(22) Filed: Oct. 30, 2020

(65) Prior Publication Data

US 2021/0050470 A1    Feb. 18, 2021

Related U.S. Application Data

(63) Continuation of application No. 16/405,153, filed on May 7, 2019, now Pat. No. 10,854,770.
(Continued)

(51) Int. Cl.
| | |
|---|---|
| *H01L 31/11* | (2006.01) |
| *H01L 31/02* | (2006.01) |
| *G02B 5/00* | (2006.01) |

(52) U.S. Cl.
CPC .......... *H01L 31/1105* (2013.01); *G02B 5/003* (2013.01); *H01L 31/02027* (2013.01)

(58) Field of Classification Search
CPC .............. G02B 5/003; H01L 31/02027; H01L 31/1075; H01L 31/11; H01L 31/1105
See application file for complete search history.

(56) References Cited

U.S. PATENT DOCUMENTS

| | | |
|---|---|---|
| 7,629,661 B2 | 12/2009 | Rafferty et al. |
| 7,884,310 B2 | 2/2011 | Buettgen |

(Continued)

FOREIGN PATENT DOCUMENTS

| | | |
|---|---|---|
| CN | 206541827 | 10/2017 |
| JP | 5523317 | 6/2014 |

(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.

(Continued)

*Primary Examiner* — Bryan R Junge
(74) *Attorney, Agent, or Firm* — Fish & Richardson P.C.

(57) ABSTRACT

Methods and devices for an avalanche photo-transistor. In one aspect, an avalanche photo-transistor includes a detection region configured to absorb light incident on a first surface of the detection region and generate one or more charge carriers in response, a first terminal in electrical contact with the detection region and configured to bias the detection region, an interim doping region, a second terminal in electrical contact with the interim doping region and configured to bias the interim doping region, a multiplication region configured to receive the one or more charge carriers flowing from the interim doping region and generate one or more additional charge carriers in response, a third terminal in electrical contact with the multiplication region and configured to bias the multiplication region, wherein the interim doping region is located in between the detection region and the multiplication region.

20 Claims, 6 Drawing Sheets

Related U.S. Application Data

(60) Provisional application No. 62/667,640, filed on May 7, 2018.

(56) References Cited

U.S. PATENT DOCUMENTS

| | | | |
|---|---|---|---|
| 8,275,270 | B2 | 9/2012 | Shushakov et al. |
| 8,405,823 | B2 | 3/2013 | Pfaff |
| 9,748,429 | B1 | 8/2017 | Davids et al. |
| 10,103,285 | B1 | 10/2018 | Lo |
| 2008/0121866 | A1 | 5/2008 | Yuan et al. |
| 2009/0315135 | A1 | 12/2009 | Finkelstein et al. |
| 2013/0062663 | A1 | 3/2013 | Yuan et al. |
| 2014/0159129 | A1 | 6/2014 | Wang |
| 2014/0291481 | A1 | 10/2014 | Zhang |
| 2016/0155883 | A1 | 6/2016 | Shi et al. |
| 2018/0026147 | A1 | 1/2018 | Zhang |
| 2018/0190698 | A1* | 7/2018 | Na .............. H01L 27/14612 |
| 2019/0165200 | A1* | 5/2019 | Masini .......... H01L 31/02027 |
| 2020/0028019 | A1 | 1/2020 | Takimoto |

FOREIGN PATENT DOCUMENTS

| | | |
|---|---|---|
| TW | 201743324 | 12/2017 |
| TW | 201810534 | 3/2018 |

OTHER PUBLICATIONS

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-μm CMOS Technology," IEEE Trans. Electron. Dev., Jun. 2011, 58(6):1702-1709.

EP Extended European Search Report in European Appln. No. 19196704.1, dated Apr. 17, 2020, 9 pages.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Geng, "Structured-light 3D surface imaging: a tutorial," Advances in Optics and Photonics, Jun. 30, 2011, 3(2):128-160.

Hutchinson et al., "High-Resolution Aliasing-Free Optical Beam Steering," Optica, vol. 3, No. 8, dated Aug. 5, 2016, 4 pages.

Joo et al., "High-sensitivity 10 Gbps Ge-on-Si photoreceiver operating at λ ~1.55 μm," Optics Express, Aug. 2, 2010, 18(16):16474-16479.

Kang et al, "Monolithic Ge/Si Avalanche Photodiodes," IEEE Xplore, 2009, 3 pages.

Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.

Kawahito et al., "A CMOS Time-of-Flight Range Image Sensor With Gates-on-Field-Oxide Structure," IEEE Sensors J. Dec. 2007, 7(12):1578-1586.

Kim et al., "A Three-Dimensional Time-of-Flight CMOS Image Sensor With Pinned-Photodiode Pixel Structure," IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron. Mar. 2001, 37(3):390-397.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):27213-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon. Jul. 30, 2010, 4:527-534.

Morse et al., "Performance of Ge-on-Si p-i-n Photodetectors for Standard Receiver Modules," IEEE Photon. Technol. Lett., Dec. 1, 2006, 18(23):2442-2444.

Perenzoni et al., "Compact SPAD-Based Pixel Architectures for Time-Resolved Image Sensors," Sensors, May 23, 2016, 16(5):745, 12 pages.

Rafferty et a., "Monolithic germanium SWIR imaging array," 2008 IEEE Conference on Technologies for Homeland Security, Waltham, MA, May 12, 2008, p. 577-582.

Ramirez et al, "Recent progress on the quantum-dot avalanche photodiode," 22nd Annual Meeting of the IEEE Lasers and Electro-optics Society, Oct. 4, 2009, 2 pages.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Sep. 21, 2015, 23(19):24433-9.

Tseng et al., "A self-assembled microbonded germanium/silicon heterojunction photodiode for 25 GB/s high-speed optical interconnects," Sci. Rep. Nov. 15, 2013, 3:3225, 6 pages.

Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.

Van Nieuwenhove et al., "Photonic Demodulator With Sensitivity Control," IEEE Sensors J. Mar. 2007, 7(3):317-318.

Wang et al, "35GB/s Ultralow-Voltage Three-Terminal Si—Ge Avalanche Photodiode," 2019 Optical Fiber Communications Conference and Exhibition, Mar. 3, 2019, 3 pages.

Wu et al., "A critically coupled Germanium photodetector under vertical illumination," Opt. Express, Dec. 31, 2012, 20(28):29338-29346.

Yin et al., "31GHz Ge n-i-p waveguide photodetectors on Silicon-on-Insulator substrate," Optics Express Oct. 17, 2007, 15(21):13965-13971.

Yokogawa et al., "IR sensitivity enhancement of CMOS Image Sensor with diffractive light trapping pixels," Sci. Rep. Jun. 19, 2017, 7(1):3832, 9 pages.

Office Action in Taiwanese Appln. No. 108115684, dated Jul. 4, 2022, 18 pages (with English Translation).

* cited by examiner

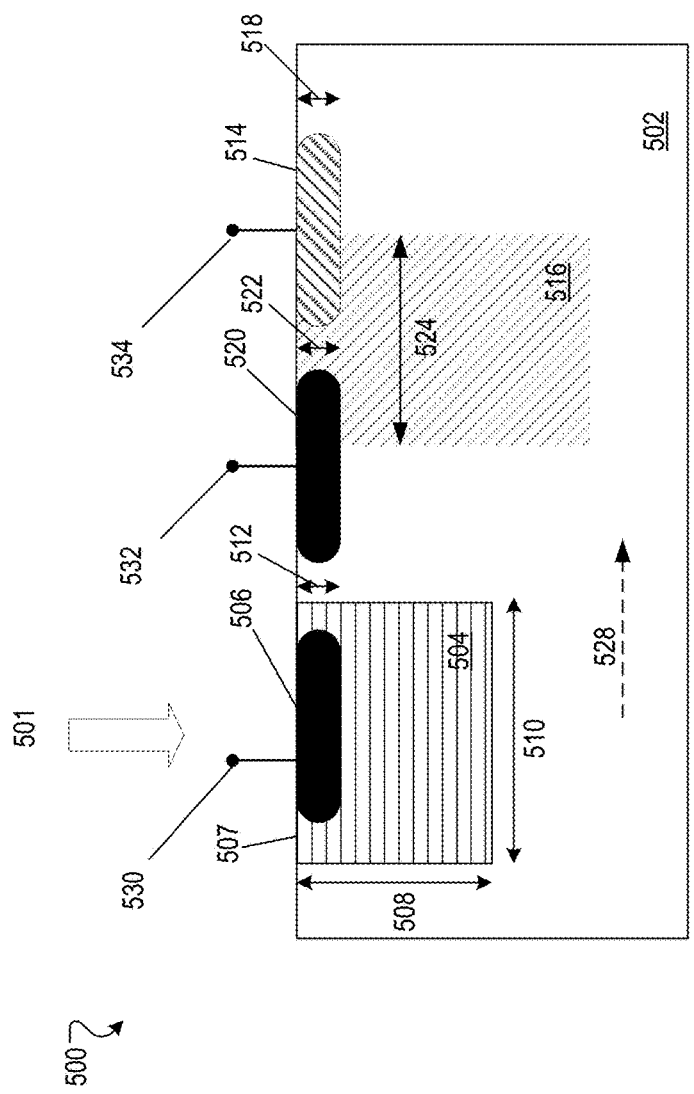

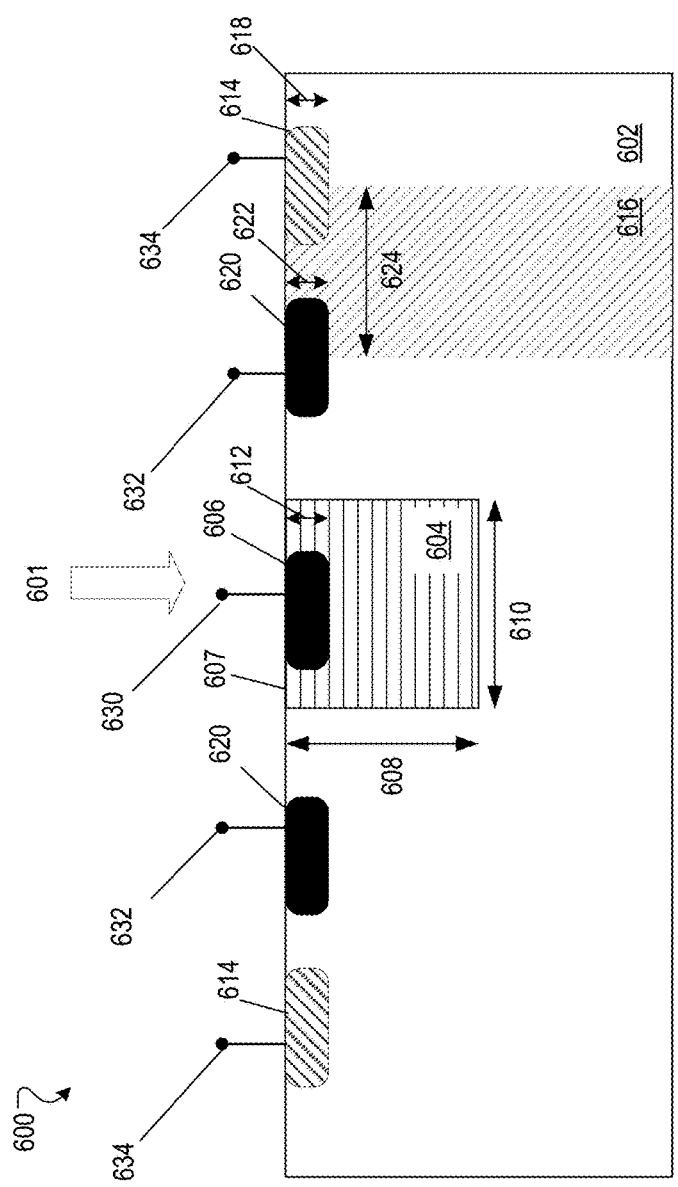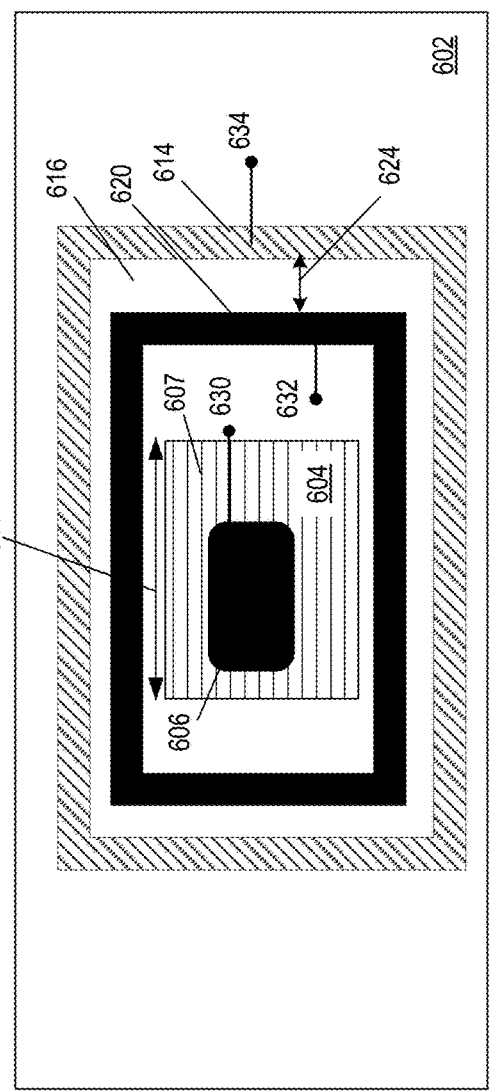

AVALANCHE PHOTO-TRANSISTOR

CROSS-REFERENCE TO RELATED APPLICATIONS

This application is a continuation of U.S. patent application Ser. No. 16/405,153, entitled "Avalanche Photo-Transistor," filed May 7, 2019, which claims the benefit under 35 U.S.C. § 119(e) of U.S. Patent Application No. 62/667,640, entitled "Avalanche Photo-Transistor," filed May 7, 2018, both of which are incorporated herein by reference in their entirety.

BACKGROUND

Light propagates in free space or through an optical medium. The light can be coupled to a transducer that coverts an optical signal to an electrical signal for processing. However, transducers can be inefficient or leaky resulting in a loss of optical energy.

SUMMARY

This specification describes technologies relating to an avalanche photo-transistor (APT) for sensing applications. The technology utilizes a three-terminal solution with an interim doping region (e.g., a $>10^{18}$ $cm^{-3}$ dopant concentration heavily-doped p+ layer) between a detection region (e.g., Ge layer) and a multiplication region (e.g., a Si layer). The interim doping region can be separately biased from the detection region and multiplication region using a separate terminal to sweep the generated carriers from the detection region to the multiplication region and amplify the generated carriers in the multiplication region.

In general, one innovative aspect of the subject matter described in this specification can be embodied in a device including a detection region configured to absorb light incident on a first surface of the detection region and generate one or more charge carriers in response to absorbing the incident light, a first terminal in electrical contact with the detection region and configured to bias the detection region, an interim doping region, having a doping concentration of a first type dopant that is greater than a threshold doping concentration, where the one or more charge carriers flow toward the interim doping region, a second terminal in electrical contact with the interim doping region and configured to bias the interim doping region, a multiplication region configured to receive the one or more charge carriers flowing from the interim doping region and generate one or more additional charge carriers in response to receiving the one or more charge carriers, and a third terminal in electrical contact with the multiplication region and configured to bias the multiplication region, where the interim doping region is located in between the detection region and the multiplication region.

Other embodiments of this aspect include corresponding systems, apparatus, and computer programs, configured to perform the actions of the methods, encoded on computer storage devices.

These and other embodiments can each optionally include one or more of the following features. In some implementations, the detection region can be a crystalline germanium layer, and the multiplication region can be a crystalline silicon layer. The detection region can be operated under non-avalanche mode and the multiplication region can be operated under avalanche mode. The first type of dopant of the interim doping region can be a p-type dopant, where a threshold doping concentration is at least $10^{18}$ $cm^{-3}$ of p-type dopant in a crystalline silicon layer.

In some implementations, the interim doping region is adjacent to the detection region, and where a second surface of the interim doping region is co-planar with the first surface of the detection region. In some implementations, the interim doping region surrounds the detection region.

In some implementations, a bias voltage different across the multiplication region can be less than 7 volts. A bias voltage difference across the detection region can be less than 3 volts.

In general, another aspect of the subject matter described in this specification can be embodied in methods that include the actions of applying a first voltage to a first terminal of an avalanche photo-transistor device, where the first terminal is in electrical contact with a detection region of the avalanche photo-transistor device, applying a second voltage to a second terminal of the avalanche photo-transistor device, where the second terminal is in electrical contact with an interim doping region of the avalanche photo-transistor device, applying a third voltage to a third terminal in electrical contact with a multiplication region of the avalanche photo-transistor device, generating, within the detection region, one or more charge carriers from incident light on a surface of the detection region, providing, through the interim doping region, the one or more charge carriers from the detection region to the multiplication region, generating, within the multiplication region, one or more additional charge carriers from the one or more charge carriers, and providing, using the avalanche photo-transistor device, a detection measurement based in part on the one or more additional charge carriers.

These and other embodiments can each optionally include one or more of the following features. In some implementations, the incident light includes one or more pulses of light traveling in a medium and reflected by an object, and the detection measurement includes identifying a direct time or an indirect phase or an indirect frequency delay due to a time-of-flight of the one or more pulses of light traveling in a medium and reflected by an object.

In some implementations, the detection measurement is a current value corresponding to the additional charge carriers generated by the multiplication region.

In some implementations, applying the second voltage and applying the third voltage includes applying a bias voltage difference between the respective second terminal and third terminal of less than 7 volts. Applying the first voltage and applying the second voltage includes applying a bias voltage difference between the respective first terminal and second terminal of less than 3 volts.

In some implementations, a flow of charge carriers and additional charge carriers is normal to the light incident on the surface of the detection region. A flow of charge carriers and additional charge carriers can be lateral to the light incident on the surface of the detection region.

Particular embodiments of the subject matter described in this specification can be implemented so as to realize one or more of the following advantages. An advantage of this technology is that the required biasing voltages to achieve an avalanche breakdown of the device can be less than 7V, e.g., 6V. Biasing voltages below 7V can allow for improved power budget requirements for incorporating the device in a larger system, e.g., in consumer applications, as well as allowing off-the-shelf components to be used to supply the voltage to the device (e.g., commercially-available CMOS-compatible power supplies). Utilizing a heavily-doped (e.g., $>10^{18}$ $cm^{-3}$ dopant concentration) p+ layer as an interim doping region between the detection layer and the multiplication layer reduces a sensitivity to doping fluctuations over a region of the device which can arise due to fabrication control issues, thereby reducing punch-through voltage fluctuations, avalanche breakdown voltage fluctuations, etc., that can arise from inconsistent doping across the device, which can cause premature punch-through, avalanche breakdown and/or excessive dark current in the device.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 5A-5B are block diagrams of another example avalanche photo-transistor device.

FIGS. 6A-6B are block diagrams of another example avalanche photo-transistor device.

DETAILED DESCRIPTION

Figure 1:
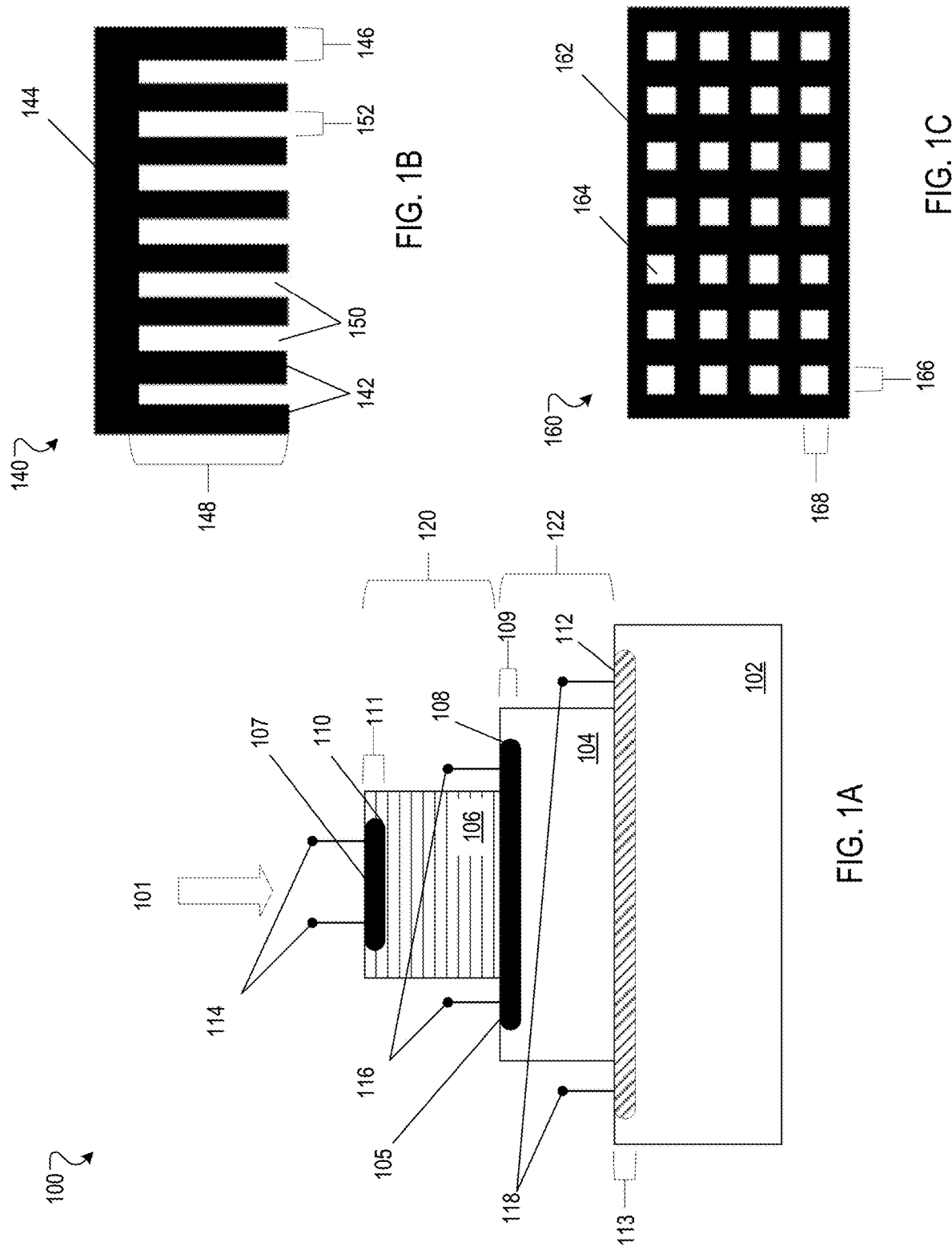
FIG. 1A is a block diagram of an example avalanche photo-transistor device.
FIG. 1B-1C are block diagrams of example geometries for doping regions.

This specification describes technologies related to an avalanche photo-transistor (APT) device for detecting and converting an optical signal to an electrical signal, and amplifying the electrical signal for processing. The APT device includes three terminals which can be used to separately bias a detection region, a multiplication region, and an interim doping region that is located between the detection region and multiplication region.

In one embodiment, a bias of a few volts, e.g., less than 3V, can be applied to the Ge detection region. An unintentional background doping level for the Ge detection region (e.g., crystalline germanium layer) may be $<10^{16}$ cm$^{-3}$. As such, the Ge detection region relies on the voltage difference between a first doping region in the Ge detection region and the interim doping region to separate electron-hole pairs and sweep the charge carriers from the detection region to the multiplication region.

In one embodiment, the interim doping region between a Ge detection region and a Si multiplication region is heavily-doped with p-type dopants, e.g., $10^{18}$-$10^{20}$ cm$^{-3}$ of p-type dopant in the interim doping region and is biased to lower and stabilize a breakdown voltage of the reversely-biased P-I-N (PIN) structure formed in the Si multiplication region, for example, to less than 7V. The biased heavily-doped interim doping region functions to lower a barrier height at the interface between the Ge detection region and Si multiplication region to allow for charge carriers generated in the Ge detection region to flow more easily to the Si multiplication region. The Si multiplication region relies on the voltage difference between a second doping region in the Si multiplication region and the interim doping region to sweep and amplify the photo-carriers.

The APT device can include a first doping region (e.g., a $>10^{18}$ cm$^{-3}$ heavily-doped p+ region) that is buried within the Ge detection region and in electrical and physical contact with a first terminal, and a second doping region (e.g., a $>10^{18}$ cm$^{-3}$ heavily-doped n+ region) that is buried within the Si multiplication region and in electrical and physical contact with a second terminal. Doping profiles for the respective first doping region and second doping region can be selected in part such that the first doping region forms an Ohmic contact with the first terminal and the second doping region forms an Ohmic contact with the second terminal.

Doping profiles, e.g., a concentration of dopant vs depth into the layer, for the interim doping region and second doping region can be selected in part to form a P-I-N (PIN) structure between the p+-doped interim doping region and n+-doped second doping region. An intrinsic region of the PIN structure between the p+ region and n+ region is formed from the silicon multiplication region located between the interim doping region and the second doping region, where the intrinsic region has a low doping level, e.g., is unintentionally doped at concentrations of $<10^{16}$ cm$^{-3}$ of dopants.

In some implementations, the APT device can be configured to be a vertically-integrated device, e.g., such that light is absorbed starting at a top surface of the device and the charge flow proceeds vertically downward through the device. FIG. 1A is a block diagram of an example avalanche photo-transistor (APT) device 100. As depicted in FIG. 1A, the APT device 100 is a vertically-integrated device, including a substrate 102, a multiplication region 104 on top of the substrate 102, and a detection region 106 on top of the multiplication region 104. The APT device 100 additionally includes an interim doping region 108 located between the multiplication region 104 and detection region 106.

The detection region 106 is configured to absorb light that is incident on a first surface 107 of the detection region 106 and generate one or more charge carriers within the detection region 106 from the incident light. The detection layer 106 can be crystalline germanium (Ge), germanium silicon (GeSi), or another material that is suitable for optical absorption and process integration. At least one surface of the detection region 106 is exposed to the incident light, e.g., a top surface of the detection region 106. As depicted in FIG. 1A, the detection region 106 is a top layer of a vertically-integrated APT device 100.

The detection region 106 has a thickness 120 that is normal to the first surface 107 and that is sufficient to allow for absorption of the incident light 101, e.g., near-infrared light, such that the incident light 101 is absorbed within the detection region 106 and where at least one charge carrier pair is generated from the incident light 101 within the detection region 106. Thickness 120 of the detection region 106 can range, for example, between 0.5-5 microns (μm).

The multiplication region 104 is configured to receive the one or more charge carriers from the interim doping region 108 and generate one or more additional charge carriers. The multiplication region 104 can be crystalline silicon, or another material that is suitable for multiplication and vertical integration. The multiplication region 104 is adjacent to the detection region 106 along an interface 105. As depicted in FIG. 1A, the multiplication region 104 is a layer supported by the substrate 102 and supportive of the detection region 106, where the interim doping region 108 is located at an interface between the multiplication region 104 and detection region 106.

The multiplication region 104 has a thickness 122 that is normal to the first surface 107 and that is sufficient for the generation of one or more additional charge carriers from the one or more carriers that are generated in the detection region 106. Thickness 122 of the multiplication region 104 can range, for example, between 100-500 nanometers (nm). The thickness 122 may determine the breakdown voltage of the multiplication region 104. For example, a thickness 122 of 100 nm corresponds to ~5-7 Volts required to achieve avalanche breakdown in the multiplication region 104. In another example, a thickness 122 of 300 nm corresponds to ~15-21 Volts required to achieve avalanche breakdown in the multiplication region 104.

A first doping region 110 is located adjacent to a surface of the detection region 106. The first doping region 110 can range a depth 111 from the surface of the detection region 106. The first doping region 110 includes a p-type dopant, e.g., boron, aluminum, gallium, or indium. A doping profile for the first doping region 110 can be, for example, at least a threshold amount (e.g. $10^{16}$ cm$^{-3}$) of constant doping concentration along the depth 111 to maintain a constant voltage throughout the first doping region 110. In one example, the first doping region 110 includes a dopant concentration of at least $10^{18}$ cm$^{-3}$ of boron for a depth 111 adjacent to a first surface 107 of the germanium detection region 106.

A second doping region 112 is located adjacent to a surface of the substrate 102. The second doping region 112 can range a depth 113 from the surface of the substrate 102. The second doping region 112 includes an n-type dopant, e.g., phosphorus, arsenic, antimony, or the like. A doping profile for the second doping region 112 can be, for example, at least a threshold amount (e.g. $10^{16}$ cm$^{-3}$) of constant doping concentration along the depth 113 to maintain a constant voltage throughout the second doping region 112. In one example, the second doping region 112 includes a dopant concentration of $10^{18}$ cm$^{-3}$ of phosphorous for a depth 113 adjacent to a surface of the substrate 102.

The interim doping region 108 is located between the multiplication region 104 and the detection region 106. As depicted in FIG. 1A, the interim doping region 108 is buried at a surface of the multiplication region 104 that is adjacent to a surface of the detection region 106. The interim doping region 108 can range a depth 109 from the surface of the multiplication region 104. A selected depth 109 of the interim doping region 108 may slightly adjust the breakdown voltage of multiplication region 104. Additionally, a depth 109 of the interim doping region 108 can be selected to be sufficiently thin to prevent Auger recombination and slowdown of charge carriers, as will be discussed in further detail with reference to FIG. 3 below.

The interim doping region 108 can be defined by a region of a threshold concentration of doping material, e.g., p-type dopant, within a crystalline silicon layer. The p-type dopant can be, for example, boron, aluminum, gallium, or indium. The interim doping region 108 has a doping concentration that is greater than a threshold doping concentration. A threshold doping concentration is a minimum number of dopants (e.g., p-type dopants) that are present within the interim doping region 108, which maintains a constant voltage throughout the interim doping region 108. In some embodiments, the threshold doping concentration within the interim doping region 108 can be $10^{16}$ cm'. Furthermore, providing a bias voltage on the interim doping region 108 and a bias voltage on the second doping region 112, which generates a voltage difference across the multiplication region 104, may to lower and stabilize the breakdown voltage of a reversely-biased P-I-N (PIN) diode formed in the multiplication region 104, for example, to set the voltage difference less than 7 V. In one example, the interim doping region 108, can be defined as a volume within a crystalline silicon layer where there is a concentration of $10^{18}$-$10^{20}$ cm$^{-3}$ of boron atoms in a silicon layer.

A doping profile for the interim doping region 108 can be, for example, at least a threshold amount of constant doping concentration along the depth 109. In one example, the interim doping region 108 includes a dopant concentration of >$10^{18}$ cm$^{-3}$ of boron buried a depth 109 adjacent to an interface 105 between the multiplication region 104 and detection region 106.

Each of the multiplication region 104, detection region 106, and interim doping region 108 are in electrical and physical contact with one or more terminals, respectively. Terminals can be metal or metal-alloy contacts that are in physical and electrical contact with a respective region. For example, the terminals can be composed of aluminum, copper, tungsten, tantalum, metal nitride, or silicide. A minimum contact area of the terminal can be selected to minimize its blockage of optical signal, but at the same time allow for physical and electrical contact with a probe sustaining an applied voltage from the probe with minimal degradation of the terminal. As depicted in FIG. 1A, the multiplication region 104, detection region 106, and interim doping region 108 are in electrical and physical contact with at least two terminals each, respectively. Although not shown in FIG. 1, the at least two terminals for each respective region are eventually in physical and electrical contact with each other.

A first terminal 114 is in electrical contact with the first doping region 110 and is configured to bias the detection region 106. More particularly, the first terminal 114 is in electrical and physical contact with the first doping region 110. The doping concentration of the first doping region 110 can be selected in part to result in a small contact resistance between the first terminal 114 and the first doping region 110 for efficient biasing, and at the same time decreases the RC time constant to increases the device operation speed.

A second terminal 116 is in electrical contact with the interim doping region 108 and is configured to bias the interim doping region 108, so that a voltage difference and an electric field is generated between the first doping region and the interim doping region. The second terminal 116 is in electrical and physical contact with the interim doping region 108. The doping concentration of the interim doping region 108 can be selected in part to result in a small contact resistance between the second terminal 116 and the interim doping region 108 for efficient biasing.

A third terminal 118 is in electrical contact with the second doping region 112 and is configured to bias the multiplication region 104, so that a voltage difference and an electric field is generated between the interim doping and the second doping region. The third terminal 118 is in electrical and physical contact with the second doping region 112. The doping concentration of the second doping region 112 can be selected in part to result in a small contact resistance between the third terminal 118 and the second doping region 112 for efficient biasing, and at the same time decreases the RC time constant to increases the device operation speed.

In some example embodiments, a total series resistance due to contact resistance and doping resistance of the respective terminals and doping layers is less than a few Ohms for APT devices operating at >Gigahertz (GHz) operation, e.g., for optical communication applications. In other example embodiments, a total series resistance due to contact resistance and doping resistance of the respective terminals and doping layer is less than a few tens of Ohms for APT devices operating at Megahertz (MHz) to GHz operation, e.g., for time-of-flight applications.

Respective applied bias voltages to the first terminal 114, second terminal 116, and third terminal 118 are described below in further detail with respect to FIGS. 2, 3, and 6.

The interim doping region 108, the first doping region 110, and the second doping region 112 can each have a respective in-plane geometry to form less than a complete layer in a plane that is parallel to the first surface 107. FIG. 1B-1C are block diagrams of example geometries of doping regions.

FIG. 1B is a block diagram 140 of an example in-plane geometry of a doping region, e.g., a first doping region 110, a second doping region 112, or an interim doping region 108. As depicted in FIG. 1B, the in-plane geometry is a finger-like structure including multiple "fingers" 142 and a base 144, where each finger 142 has a width 146 and a length 148. A gap 150 between adjacent fingers 142 has a width 152.

FIG. 1C is a block diagram 160 of another example in-plane geometry of a doping region 162, e.g., a first doping region 110, a second doping region 112, or an interim doping region 108. As depicted in FIG. 1C, the in-plane geometry is a mesh-like structure including gaps 164 in the doping region having a width 168 and length 166 Though depicted in FIG. 1C as square gaps 164 in the doping region 162, other geometries for the gap are conceivable, e.g., circular, rectangular, polygonal, or the like.

Though depicted in FIGS. 1B and 1C as in-plane geometries forming less than complete layers, one or more of the doping layers, e.g., a first doping region 110, a second doping region 112, or an interim doping region 108 of the APT device 100 can be a complete layer.

Referring now to FIG. 1A, under illumination conditions, the APT device 100 is illuminated by a light source 101. Light source 101 can be a near-infrared (NIR) light source, emitting wavelengths of light ranging between, for example, 750 nm to 1.65 microns. For example, a NIR light source can emit light with a peak intensity at a wavelength of 850 nm, 1.31 microns, 1.55 microns or the like. In one example, a NIR light source 101 is direct or reflected light from a NIR laser, light emitting diodes (LEDs), or another NIR light source used in optical communications and/or optical sensing applications. The light source 101 is incident on at least a first surface 107 of the detection region 106 such that the detection region 106 absorbs light from the light source 101 and generates one or more carriers from the light of the light source 101 within the detection region 106. In a vertically-integrated device, as depicted in FIG. 1A, a flow of charge carriers and additional charge carriers is normal to the light incident on the surface of the detection region. Operation of the APT device 100 under illumination conditions will be described in further detail with reference to FIGS. 2, 3, and 6 below.

Fabrication of an Avalanche Photo-Transistor

The various aspects of the APT device 100 as depicted in FIG. 1A can be fabricated on the substrate 102, for example, using complementary metal-oxide-semiconductor (CMOS) microfabrication techniques, e.g., photolithography processes, etching processes, deposition processes, and the like. In some embodiments, fabrication of the APT device 100 can include forming a second doping region 112 embedded in a silicon substrate 102 using, for example, ion implantation, diffusion, rapid thermal processing, or other similar processes.

A silicon multiplication layer 104 can be grown on the silicon substrate 102 using various vacuum techniques, e.g., chemical-vapor deposition (CVD), metal-organic chemical vapor deposition (MOCVD), molecular beam epitaxy (MBE), atomic layer deposition (ALD), or the like. In some implementations, the second doping region 112 is buried within a silicon substrate 102, e.g., using ion implantation, where an undoped layer of silicon above the buried second doping region forms a silicon multiplication layer 104.

An interim doping region 108 can be embedded adjacent to an interface 105 of the silicon multiplication layer 104 during the growth process of the silicon multiplication region 104, e.g., by using in-situ dopants during the growth process of the silicon material. In some implementations, the interim doping region 108 can be formed using implantation or diffusion techniques.

A germanium detection region 106 can be formed on top of the silicon multiplication region 104, for example, using CVD, MOCVD, MBE, ALD, or the like. The first doping region 110 can be embedded adjacent to a first surface 107 of the germanium detection region 106 during the growth process of the germanium detection region 106, e.g., by using in-situ dopants during the growth process of the germanium material. In some implementations, the first doping region 110 can be formed using implantation or diffusion techniques.

Terminals 114, 116, and 118 can be fabricated on the APT device 100 in contact with respective first doping region 110, interim doping region 108, and second doping region 112, using, for example a process including a deposition step, a lift-off step, or an etch step.

Example Operation of the Avalanche Photo-Transistor

Figure 2:
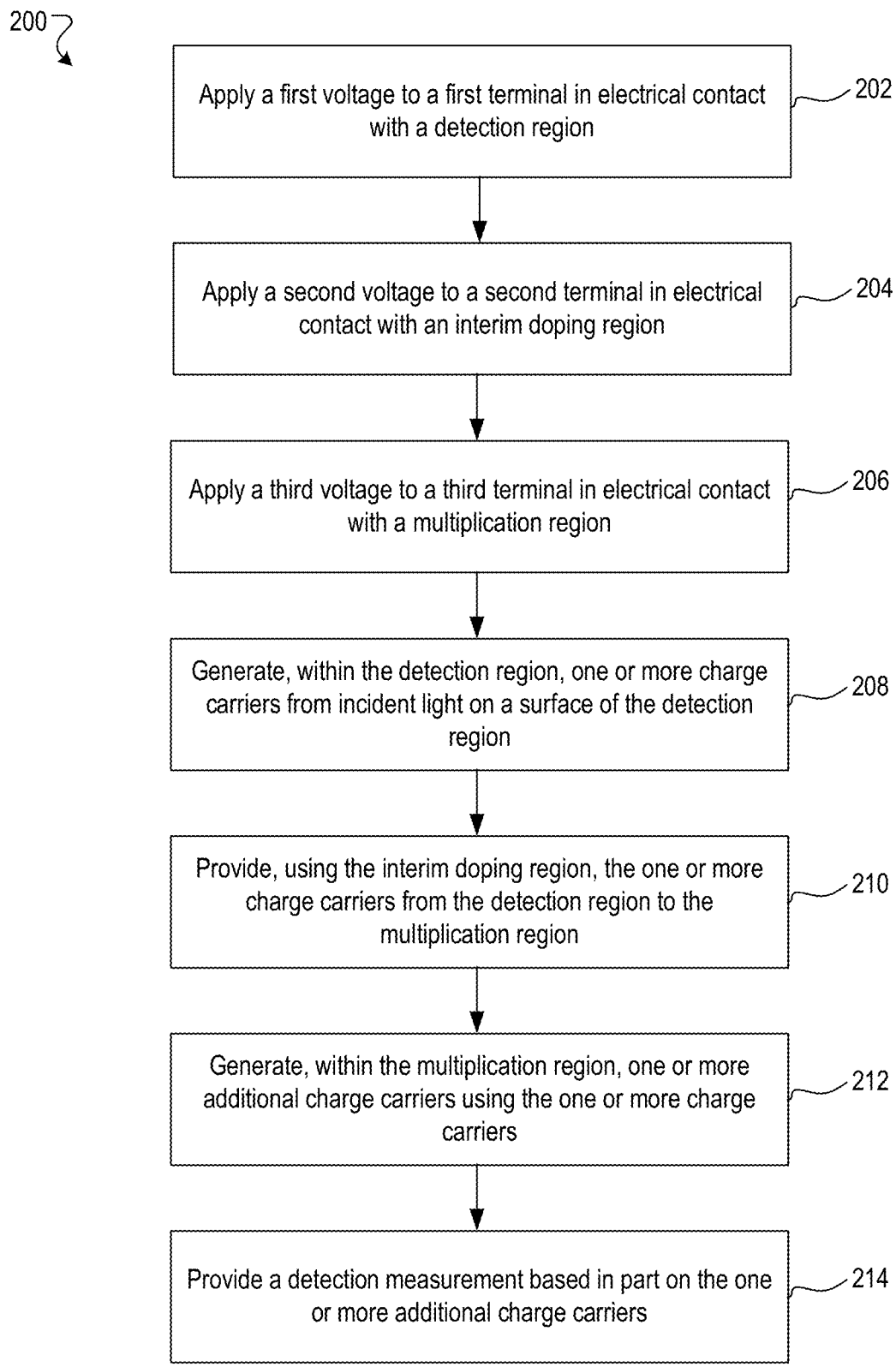
FIG. 2 is a flow diagram of an example process for avalanche photo-transistor.

FIG. 2 is a flow diagram of an example process 200 for avalanche photo-transistor under operating conditions. Operating conditions of the APT device, as described here, include applying one or more voltages on the respective terminals of the APT device, e.g., the first terminal 114, the second terminal 116, and the third terminal 118. Operating conditions can additionally include exposing at least a surface of the APT device, e.g., a first surface 107, to illumination of a light source.

A first voltage is applied to a first terminal in electrical contact with a detection region (202). With reference to FIG. 1A, a first voltage $V_U$ is applied to a first terminal 114 in electrical contact with a detection region 106. In one example, a first voltage $V_U$ applied to the first terminal 114 is 0 Volts.

Referring back to FIG. 2, a second voltage is applied to a second terminal in electrical contact with an interim doping region (204). With reference to FIG. 2, a second voltage $V_M$ is applied to a second terminal 116 in electrical contact with an interim doping region 108. Second voltage $V_M$ can be selected in part to sweep the charge carriers from the detection region 106 to the multiplication region 104. Below a threshold second voltage, the interim doping layer 108 can act as a gate between the detection region 106 and the multiplication region 104, such that a voltage above the threshold second voltage is needed at the second terminal to facilitate the movement of charge carriers from detection region 106 to the multiplication region 104, in other words, to bias the gate. For example, when the first voltage $V_U$ applied to the first terminal 114 is 0 Volts, a second voltage $V_M$ applied to the second terminal 116 is less than or equal to 5 Volts, e.g., 3 Volts.

In some implementations, applying the first voltage $V_U$ and applying the second voltage $V_M$ includes applying a bias voltage difference and an electric field between the respective first terminal 114 and second terminal 116 of less than 5 volts. The bias voltage difference between the respective first terminal 114 and the second terminal 116 can be selected to be sufficient to sweep the generated one or more charge carriers from the detection region 106, e.g., the Ge layer, to the interim doping region 108 at a desired transit time. In one example, the bias voltage difference between the first terminal 114 and the second terminal 116 is ~1-2 Volts for a detection region 106 that is composed of germanium.

Referring back to FIG. 2, a third voltage is applied to a third terminal in electrical contact with a multiplication region (206). With reference to FIG. 1A, a third voltage $V_L$ is applied to a third terminal 118 in electrical contact with a multiplication region 104. For example, when the first voltage $V_U$ applied to the first terminal 114 is 0 Volts and the second voltage $V_M$ applied to the second terminal 116 is 3 Volts, a third voltage $V_L$ applied to the third terminal 118 is less than or equal to 12 Volts, e.g., 10 Volts.

In some implementations, applying the second voltage $V_M$ and applying the third voltage $V_L$ includes applying a bias voltage difference and an electric field between the respective second terminal 116 and third terminal 118 of less than 9 volts. The bias voltage difference between the respective second terminal 116 and the third terminal 118 can be selected to be sufficient to sweep and amplify the generated one or more charge carriers from the interim doping region 108 to the multiplication region 104, e.g., the Si layer, at a desired transit time and multiplication gain. In one example, the bias voltage difference between the second terminal 116 and the third terminal 118 is ~5-6 Volts for a detection region 106 that is composed of silicon.

Figure 3:
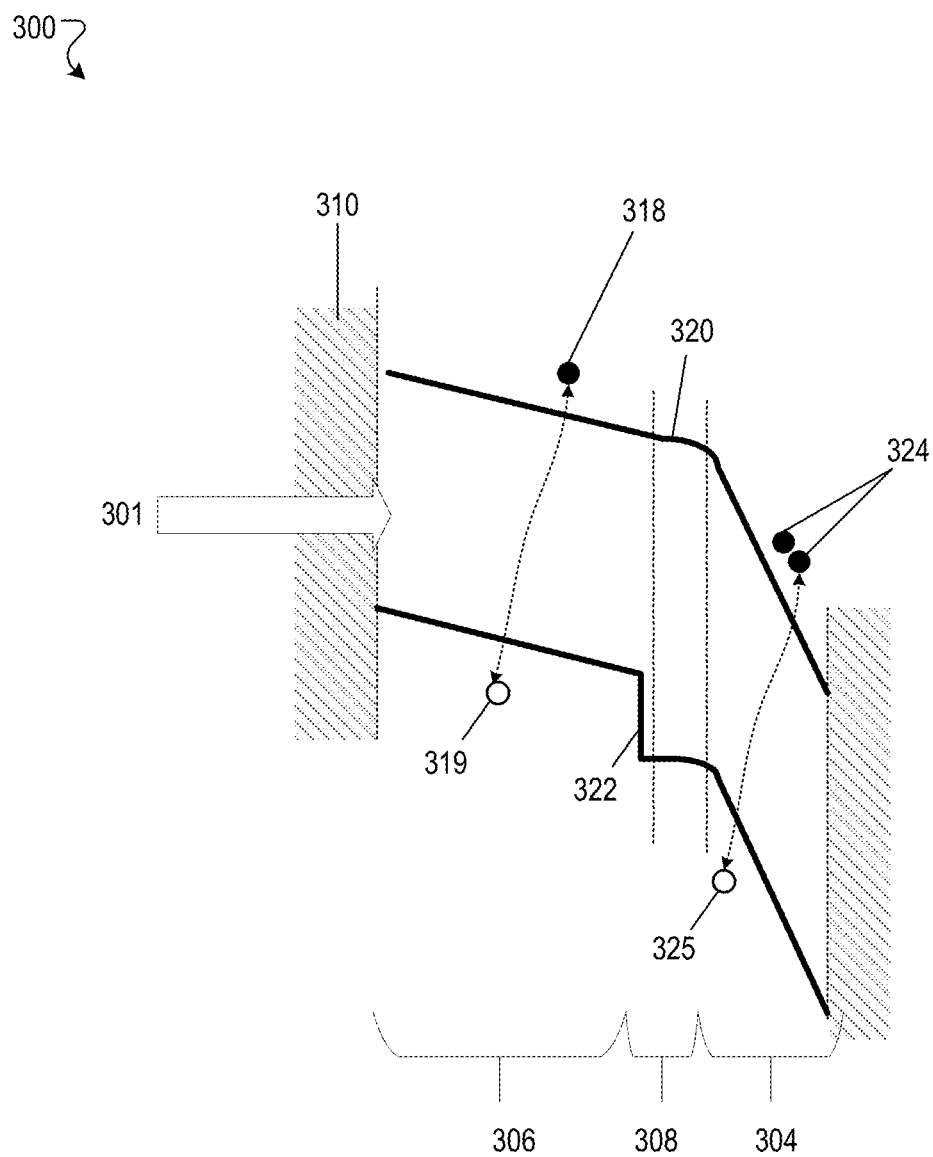
FIG. 3 is a schematic of an example band diagram for an avalanche photo-transistor device under operating conditions.

Referring now to FIG. 3, which is a schematic of an example band diagram 300 for an avalanche photo-transistor (APT) device (e.g., APT device 100) under operating conditions. Band diagram 300 depicts an APT device including a multiplication region 304, a detection region 306, and an interim doping region 308 between the multiplication region 304 and detection region 306. In accordance with some embodiments, the detection region 306 includes a first doping region 310 where the first doping region is a heavily-doped p+ region with a charged concentration $>10^{18}$ cm$^{-3}$. The multiplication region 304 includes a second doping region 312 where the second doping region is a heavily-doped n+ region with a charge concentration of $>10^{18}$ cm$^{-3}$. The interim doping region 308 is a heavily-doped layer with a charge concentration $>10^{18}$ cm$^{-3}$.

As described above with reference to FIG. 2 in steps 202-206, a set of voltages $V_U$, $V_M$, and $V_L$, are applied to the APT device at respective terminals to result in a band diagram as depicted in FIG. 3. For example, a bias voltage difference is applied between a first terminal (e.g., first terminal 114) in electrical contact with the first doping region 310 and a second terminal (e.g., second terminal 116) in electrical contact with the interim doping region 308 that is less than 3 Volts, and a bias voltage difference is applied between the second terminal and a third terminal (e.g., third terminal 118) in electrical contact with the second doping region 312 that is less than 7 Volts. If the first doping region, the interim doping region, and the second doping region are p+, p+, and n+ doped, respectively, the PIN junction formed in the multiplication region 104 can be characterized as a reverse-biased PIN junction.

Referring back to FIG. 2, one or more charge carriers are generated within the detection region using incident light on a surface of the detection region (208). The photocurrent associated with the charge carriers generated within the detection region is in accordance with the electric field formed between the first doping region and interim doping region. With reference to FIG. 3, incident light from a light source 301 is exposed to a surface of the detection region 306, e.g., NIR light from a NIR light source 301. Light from the light source 301 is absorbed within the detection region 306, e.g., within the layer of crystalline germanium, and one or more charge carriers, e.g., electron 318 and hole 319 pairs, are generated from the absorbed light.

Referring back to FIG. 2, one or more charge carriers are provided from the detection region to the multiplication region using the interim doping region (210). For a sufficient first voltage $V_U$ and second voltage $V_M$ applied to the first doping region and the interim doping region, respectively, the charge carriers are swept from the detection region to the multiplication region. As depicted in FIG. 3, the one or more charge carriers, e.g., electrons 318, are swept from the detection region 306 to the multiplication region 304 over a barrier 320 with little or no electric field depicted in the band diagram 300. Charge separation between electrons 318 and holes 319 can be facilitated by a barrier 322 to holes 319 generated by a band alignment of the germanium layer and silicon layer at the interface between the detection region 306 and interim doping region 308. The bias voltage difference that is applied between the second terminal and a third terminal can result in a strong electric field achieving an avalanche process in the multiplication region 304, which facilitates the flow of electrons 318 to the multiplication region 304 and amplifies the numbers of electrons within the multiplication region 304.

One or more additional charge carriers are generated, as described in FIG. 2, using the one or more charge carriers within the multiplication region (212). Once the one or more electrons 318 of FIG. 3 are swept into the multiplication region 304, a process of charge multiplication can occur, generating additional electron 324 and hole 325 pairs in the multiplication region 304. For a sufficient applied bias voltage difference between the second terminal (e.g., second terminal 116) and the third terminal (e.g., third terminal 118), e.g., at least 7 Volts, the multiplication region 304 operates under avalanche process conditions, producing an amplification of the one or more carriers by generating one or more additional carriers. The generated one or more additional holes 325 move towards the heavily p+ doped first doping region 310 and are collected at the first terminal, while the one or more additional electrons 324 flow towards the heavily n+ doped second doping region 312 and are collected at the third terminal.

Referring back to FIG. 2, a detection measurement is provided based in part on the one or more additional charge carriers (214). In some implementations, the detection measurement is a current value corresponding to the additional charge carriers generated by the multiplication region 304 that are collected by the n+ second doping region 312 by the third terminal. Further details of the collected current values are discussed below with reference to FIG. 4.

In some implementations, the incident light from light source 301 includes one or more pulses of light traveling in a medium (e.g., air, liquid, stone, brick, etc.) and reflected by an object. The object can be, for example, a person (e.g., hand, face, fingers, etc.), a vehicle (e.g., car, plane, etc.), a building, or another type of object. The pulses of light traveling in the medium can be from a NIR laser source, where the pulses are reflected off of the object and then incident on the APT device. The detection measurement includes identifying a direct time or an indirect phase or an indirect frequency delay due to a time-of-flight of the one or more pulses of light traveling in the medium and reflected by the object. In some implementations, the incident light from light source 301 includes one or more pulses of light traveling in a confined medium (e.g., optical fiber, optical waveguide) and transmitted through. The pulses of light traveling in the medium can be from a NIR laser source, where the pulses are incident on the APT device. The detection measurement includes identifying a "zero" state or a "one" state or a state from the total $2^n$ states of digital optical communication using one or more pulses of light traveling in the medium.

Figure 4:
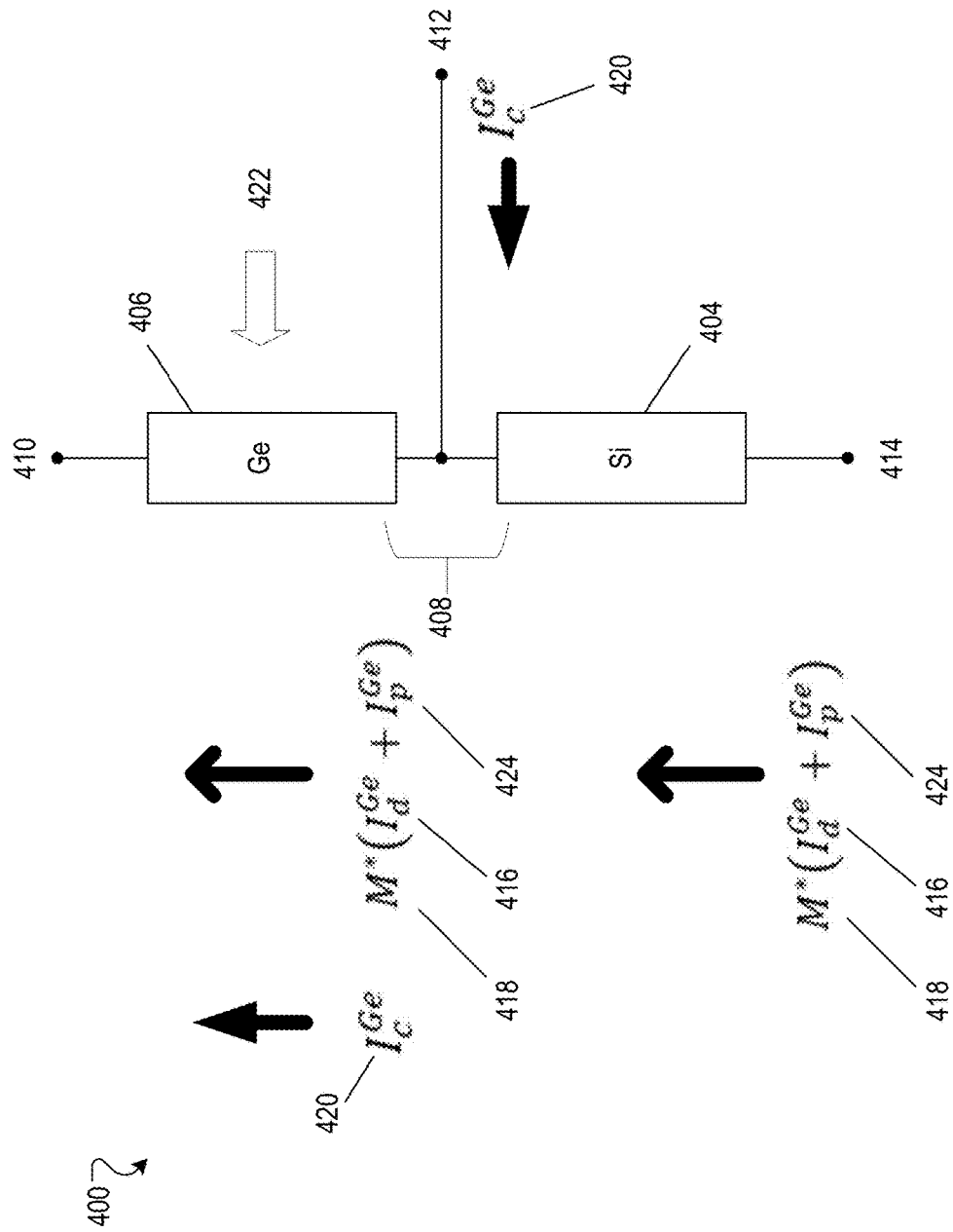
FIG. 4 is a schematic of an effective device circuitry for an avalanche photo-transistor under operating conditions.

FIG. 4 is an equivalent circuitry 400 for an avalanche photo-transistor (APT) device under operating conditions. As described above with reference to FIG. 1A, the APT device 402 depicted in FIG. 4 includes a silicon multiplication region 404, a germanium detection region 406, and an interim doping region 408 located between the multiplication region 404 and detection region 406. A first terminal 410 is in electrical contact with the germanium detection region 406, at a first doping region buried in the germanium detection region 406. A second terminal 412 is in electrical contact with the interim doping region 408. A third terminal 414 is in electrical contact with the silicon multiplication region 404 at a second doping region that is adjacent to the multiplication region 404.

Under operating conditions, a first voltage $V_U$ is applied to the first terminal 410, e.g., 0 Volts. A second voltage $V_M$ is applied to the second terminal 412, e.g., 3 Volts. A third voltage $V_L$ is applied to the third terminal 414, e.g., 10 Volts. The voltage bias difference applied between the first terminal 410 and second terminal 412 (i.e., 3V bias voltage difference given the aforementioned $V_U$ and $V_M$) functions to bias the germanium detection region 406 and in return generate a dark current $I_d^{Ge}$ 416 flowing towards the first terminal 410 from the detection region 406.

The voltage bias difference between the second terminal 412 and the third terminal 414 (i.e., 3V bias voltage difference given the aforementioned $V_M$ and $V_L$) functions to bias the silicon multiplication region 404, causing the silicon multiplication region 404 to operate under avalanche process conditions. A multiplication factor M* 418 due to the avalanche process by electron injection of charge carriers that are present in the biased multiplication region 404 operating under avalanche process conditions results in multiplication gain of the APT device 402. The second voltage $V_M$ applied to the second terminal 412 generates a leaking current $I_c^{Ge}$ 420 from the second terminal 412 flowing towards the first terminal 410, and measurable at the first terminal 410.

Under dark conditions, e.g., no illumination of the APT device 402, the multiplication factor M* 418 augments the dark current $I_d^{Ge}$ 416. A current measurement at the first terminal 410 under dark conditions $I_u(D)$ is equal to:

$$I_u(D)=M^*(I_d^{Ge})+I_c^{Ge} \quad (1)$$

Under illumination conditions, e.g., light is exposed to the APT device, the APT device 402 is exposed to incident light from a light source 422, e.g., a NIR laser. Photocurrent $I_p^{Ge}$ 424 is generated from the conversion of light energy incident on the germanium detection region 406 to one or more charge carriers, e.g., electron-hole pairs, which are separated such that electrons 426 flow towards the silicon multiplication region 404 and third terminal 414 (and holes 427 flow towards the first terminal 410). The electrons 426 are amplified and generate one or more additional charge carriers in the multiplication region 404. A current measurement at the first terminal 410 under illumination conditions $I_u(L)$ is equal to:

$$I_u(L)=M^*(I_d^{Ge}+I_p^{Ge})+I_c^{Ge} \quad (2)$$

An amplified photocurrent measurement can be determined, for example, by subtracting out the dark-condition current measurement $I_u(D)$ from the illumination-condition current measurement $I_u(L)$, where the result is a current value corresponding to the additional charge carriers generated by the multiplication region 404.

In some implementations, the detection measurement includes identifying a direct time or an indirect phase or an indirect frequency delay due to a time-of-flight of the one or more pulses of light traveling in the medium and reflected by the object. A direct time delay, indirect phase delay, or indirect frequency delay, etc., of a light pulse can be determined between a time of the pulse of the light source 422 and a measurement $I_u(D)$ of the photocurrent by the APT device 402. For example, a time-to-digital converter is used to measure the direct time delay between firing an NIR laser pulse and detecting the reflected NIR laser pulse. For example, a local oscillator having the same waveform of an amplitude-modulated continuous-wave NIR laser or a frequency-modulated continuous-wave NIR laser is used to mix with the reflected NIR laser and obtain an indirect phase delay or indirect frequency delay.

Other Embodiments of the Avalanche Photo-Transistor

In some embodiments, an avalanche photo-transistor (APT) device can be configured to be a laterally-integrated device, e.g., such that light is absorbed at a top surface of the device and the charge flow proceeds laterally through a width of the device. In other words, a flow of charge carriers and additional charge carriers is lateral to the light incident on the surface of the detection region. A laterally-integrated device may have a heavily-doped p+ region laterally spaced apart from a Ge detection region, e.g., adjacent to or surrounding the Ge detection region. FIGS. 5A-B and 6A-B are two example embodiments of laterally-integrated device structures for the APT device. FIGS. 5A-5B are block diagrams of another example avalanche photo-transistor device, where the interim doping region is laterally spaced apart from the detection region. FIG. 5A is a cross-sectional view of a unilateral APT device 500, where the flow of charge carriers and additional charge carriers is lateral with respect to a top surface of the APT device 500. Unilateral APT device 500 includes a substrate 502, e.g., a silicon substrate. The substrate 502 may additionally include a silicon layer grown epitaxially on top of the substrate 502. A detection region 504, e.g., germanium detection region, is embedded within the silicon layer grown epitaxially and/or the silicon substrate 502. The embedded germanium detection region is fabricated in part by etching the silicon layer grown epitaxially and/or the silicon substrate 502 to form a recess, and then selectively grow a germanium in the recess. The germanium detection region 504 can include a thickness 508 ranging from 0.5 μm-5 μm and width 510 ranging 0.5 μm-50 um.

A first doping region 506 is embedded within the detection region 504 adjacent to a surface 507 of the detection region 504, where the surface 507 is a top surface where light is incident on the APT device from a light source 501. The first doping region 506 includes a doping profile that is constant doping concentration above a threshold (e.g. $10^{16}$ cm$^{-3}$) for a thickness 512 into the detection region 504. Thickness 512 can be, for example, at least $10^{18}$ cm$^{-3}$ p+ doping concentration along the thickness 512. In some example embodiments, a doping layer thickness 512 of the first doping region 506 can be between 20 nm and 500 nm. In other embodiments, the doping layer thickness 512 has other values.

A second doping region 514 is adjacent to the detection region 504 and partially or fully embedded within a multiplication region 516, e.g., the silicon layer grown epitaxially, and adjacent to the surface 507. The second doping region 514 includes a doping profile that is a constant doping concentration above a threshold (e.g. $10^{16}$ cm$^{-3}$) for a thickness 518 into the multiplication region 516. Thickness 518 can be, for example, at least $10^{18}$ cm$^{-3}$n+ doping concentration along the thickness 518. In some example embodiments, a doping layer thickness 518 of the second doping region 514 can be between 20 nm and 1500 nm. In other embodiments, the doping layer thickness 518 has other values.

An interim doping region 520 is located between the first doping region 506 and second doping region 514 and embedded in the silicon material, e.g., the silicon substrate 502 that is between the first doping region 506 and second doping region 514. The interim doping region 520 includes a doping profile having at least a threshold concentration (e.g. $10^{16}$ cm$^{-3}$) of carriers along a thickness 522 of the interim doping region. Thickness 522 can include, for example, at least $10^{18}$ cm$^{-3}$p+ doping concentration along the thickness 522. In some example embodiments, interim doping region thickness 522 of the interim doping layer 52 can be between 20 nm and 500 nm. In other embodiments, the doping layer thickness 522 has other values.

A distance 524 between the interim doping region 520 and the second doping region 514 defines the multiplication region 516 of the APT device 500, similar to the multiplication region 104 of the vertically-integrated device in FIG. 1A. As depicted in FIG. 5A, one or more charge carriers generated in the detection region 504 flow along direction 528 laterally towards the multiplication region 516, where one or more additional charge carriers are generated by an avalanche process.

Each of the first doping region 506, interim doping region 520, and second doping region 514 is in electrical and physical contact with a respective terminal. The first doping region 506 is in electrical contact with a first terminal 530, which can be used to apply a first voltage $V_U$ to the first terminal 530. The interim doping region 520 is in electrical contact with a second terminal 532, which can be used to apply a second voltage $V_M$ to the second terminal 532. The second doping region 514 is in electrical contact with a third terminal 534, which can be used to apply a third voltage $V_L$ to the third terminal 534.

FIG. 5B is a top-down view of the unilateral APT device 500. As depicted in FIG. 5B, the detection region 504 surrounds the first doping region 506, and the interim doping region 520 is in-between the first doping region 506 and the second doping region 514.

Benefits of the laterally-integrated device, e.g., shown in FIG. 5A, compared to the vertically integrated device, e.g., shown in FIG. 1A, is the flat surface topography. It facilitates the back-end metal process by reducing in-plane stresses and better-controlling chemical-mechanical polishing.

In another embodiment, the interim doping region of the APT device surrounds the detection region. FIGS. 6A-6B are block diagrams of another example avalanche phototransistor device, where the interim doping region 620 of the bilateral APT device surround the detection region. In contrast to the single direction of flow 528 of the unilateral APT device 500 described in FIGS. 5A-B, the bilateral APT device 600 described in FIGS. 6A-B includes multiple directions of flow for the generated charge carriers. FIG. 6A depicts a cross-sectional view of the bilateral APT device 600. Bilateral APT device 600 includes a substrate 602, e.g., a silicon substrate. The substrate 602 may additionally include a silicon layer grown epitaxially on top of the substrate 602. A detection region 604, e.g., germanium detection region, is embedded within the silicon layer grown epitaxially and/or the silicon substrate 602. Similar to APT device 500, the embedded germanium detection region is fabricated in part by etching the silicon layer grown epitaxially and/or the silicon substrate 602 to form a recess, and then selectively grow a germanium in the recess. The germanium detection region 604 can include a thickness 608 ranging from 0.5 μm-5 μm and a width 610 ranging from 0.5 μm-50 μm.

A first doping region 606 is embedded within the detection region 604 adjacent to a surface 607 of the detection region 604, where a surface 607 is a top surface where light is incident on the APT device from a light source 601. The first doping region 606 includes a doping profile that is constant doping concentration above a threshold (e.g. $10^{16}$ cm$^{-3}$) for a thickness 612 into the detection region 604. Thickness 612 can include, for example, at least $10^{18}$ cm$^{-3}$p+ doping concentration along the thickness 612.

As depicted in FIG. 6B, a second doping region 614 surrounds the detection region 604 and partially or fully embedded within a multiplication region 616, e.g., the silicon layer grown epitaxially, and adjacent to the surface 607. The second doping region 614 includes a doping profile that is a constant doping concentration above a threshold (e.g. $10^{16}$ cm$^{-3}$) for a thickness 618 into the multiplication region 616. Thickness 618 can be, for example, at least $10^{18}$ cm$^{-3}$n+ doping concentration along the thickness 618.

As depicted in FIG. 6B, the interim doping region 620 is located between the detection region 604 and the second doping region 614 and surrounds the detection region 604. The interim doping region 620 is embedded within the silicon material, e.g., the silicon substrate 602. The interim doping region 620 includes a doping profile having at least a threshold concentration of carriers along a thickness 622 of the interim doping region. Thickness 622 can be, for example, at least $10^{18}$ cm$^{-3}$ p+ doping concentration along the thickness 622.

A distance 624 between the interim doping region 620 and the second doping region 614 defines the multiplication region 616 of the bilateral APT device 600, similar to the multiplication region 104 of the vertically-integrated device in FIG. 1A. As depicted in FIG. 6A, one or more charge carriers generated in the detection region 504 flow laterally towards the multiplication region 616 that surrounds the detection region, where one or more additional charge carriers are generated by an avalanche process.

Each of the first doping region 606, interim doping region 620, and second doping region 614 is in electrical and physical contact with a respective terminal. The first doping region 606 is in electrical contact with a first terminal 630, which can be used to apply a first voltage $V_U$ to the first terminal 630. The interim doping region 620 is in electrical contact with a second terminal 632, which can be used to apply a second voltage $V_M$ to the second terminal 632. The second doping region 614 is in electrical contact with a third terminal 634, which can be used to apply a third voltage $V_L$ to the third terminal 634.

In some embodiments, light incident on the first surface of the detection region of the APT device is coupled to the first surface of the APT device via free space. The incident light can be, for example, normal to the first surface of the detection region, as depicted by incident light 101 incident on surface 107 in FIG. 1A. In some embodiments, light incident on the detection region of the APT device can be coupled to the detection region of the APT device via evanescent coupling through a waveguide. The APT device can be integrated with a waveguide, e.g., a Si rib waveguide, where light propagates through the passive waveguide and then evanescently couples to the detection region of the APT device, e.g., the Ge absorption region. The evanescent coupling of light can be in-plane, e.g., in a direction parallel to a first surface of the detection region.

In accordance with aforementioned descriptions and corresponding figures, it is understood that the present application disclose the embodiments of APT device including detection region and multiplication region to generate the photocurrent, where the detection region is operated under a non-avalanche mode and configured to detect and generate the charge carriers, and the multiplication region is operated under an avalanche mode and configured to amplify the charge carriers. Operation under avalanche mode is when operating conditions include a multiplication gain that is greater than 1 (M>1), and operation under "non-avalanche" mode includes a multiplication gain that is equal to 1 (M=1).

Specifically, the APT device applies three constant bias voltages on a first doping region, interim doping region, and second doping region respectively. The bias voltage on interim doping region can be properly designed to stabilize the operations of the detection region and multiplication region. In another aspect, the material of the detection region (e.g., germanium) and the material of the multiplication region (e.g., silicon) are different. The utilizations of the material difference may improve the detection and multiplication individually.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method for operating an avalanche photo-transistor device having a detection region, a multiplication region, and an interim doping region located in between the detection region and the multiplication region, the method comprising:
   applying a first voltage to a first terminal of the avalanche photo-transistor device, wherein the first terminal is in electrical contact with the detection region that receives an incident light and generates one or more charge carriers in response to receiving the incident light;
   applying a second voltage to a second terminal of the avalanche photo-transistor device, wherein the second terminal is in electrical contact with the interim doping region, such that the one or more charge carriers are provided from the detection region to the multiplication region;
   applying a third voltage to a third terminal to bias the multiplication region of the avalanche photo-transistor device, such that one or more additional charge carriers are generated from the one or more charge carriers within the multiplication region; and
   providing, by the avalanche photo-transistor device, the one or more additional charge carriers for a detection measurement,
   wherein the first terminal is in electrical contact with a first doping region in the detection region of the avalanche photo-transistor device, and a first doping profile for the first doping region is at least $10^{16}$ cm$^{-3}$, wherein the third terminal is in electrical contact with a second doping region of the avalanche photo-transistor device, and a second doping profile for the second doping region is at least $10^{16}$ cm$^{-3}$, and wherein the interim doping region has a doping concentration greater than a threshold doping concentration at least $10^{16}$ cm$^{-3}$.

2. The method of claim 1, wherein the incident light comprises one or more pulses of light traveling in a medium and being reflected from an object, and the detection measurement comprises identifying a time or a phase or a frequency delay due to a time-of-flight of the one or more pulses of light reflected from the object.

3. The method of claim 1, wherein the detection measurement is a current value corresponding to the additional charge carriers generated by the multiplication region.

4. The method of claim 1, wherein applying the second voltage and applying the third voltage comprises applying a bias voltage difference to achieve an avalanche process in the multiplication region.

5. The method of claim 1, wherein applying the first voltage and applying the second voltage comprises applying a bias voltage difference between the first terminal and the second terminal of less than 3 volts.

6. The method of claim 1, wherein the first doping region has a first type of dopant, the interim doping region has the first type of dopant, the second doping region has a second type of dopant, and the first type of dopant is different from the second type of dopant.

7. The method of claim 1, wherein a thickness of the multiplication region is between 100-500 nanometers.

8. The method of claim 1, wherein a material of the detection region comprises germanium.

9. A system comprising:
   circuitry configured, during operation, to:

apply a first voltage to a first terminal of an avalanche photo-transistor device, wherein the first terminal is in electrical contact with a detection region that receives an incident light and generates one or more charge carriers in response to receiving the incident light;

apply a second voltage to a second terminal of the avalanche photo-transistor device, wherein the second terminal is in electrical contact with an interim doping region, such that the one or more charge carriers are provided from the detection region to a multiplication region of the avalanche photo-transistor device;

apply a third voltage to a third terminal to bias the multiplication region of the avalanche photo-transistor device, such that one or more additional charge carriers are generated from the one or more charge carriers within the multiplication region; and provide, by the avalanche photo-transistor device, the one or more additional charge carriers for a detection measurement, wherein the first terminal is in electrical contact with a first doping region in the detection region of the avalanche photo-transistor device, and a first doping profile for the first doping region is at least $10^{16}$ cm$^{-3}$, wherein the third terminal is in electrical contact with a second doping region of the avalanche photo-transistor device, and a second doping profile for the second doping region is at least $10^{16}$ cm$^{-3}$, and wherein the interim doping region has a doping concentration greater than a threshold doping concentration at least $10^{16}$ cm$^{-3}$.

10. The system of claim 9, wherein the circuitry is configured so that, during operation, (a) applying the second voltage and applying the third voltage comprises applying a bias voltage difference to achieve an avalanche process in the multiplication region or (b) applying the first voltage and applying the second voltage comprises applying a bias voltage difference between the first terminal and the second terminal of less than 3 volts.

11. The system of claim 9, further comprising the avalanche photo-transistor device that comprises the detection region, the interim doping region, and the multiplication region.

12. The system of claim 11, wherein a material of the detection region comprises germanium.

13. A method for operating an avalanche photo-transistor device having a detection region, a multiplication region, and an interim doping region located in between the detection region and the multiplication region, the method comprising:

applying a first voltage to a first terminal of the avalanche photo-transistor device, wherein the first terminal is in electrical contact with the detection region that receives an incident light and generates one or more charge carriers in response to receiving the incident light;

applying a second voltage to a second terminal of the avalanche photo-transistor device, wherein the second terminal is in electrical contact with the interim doping region, such that the one or more charge carriers are provided from the detection region to the multiplication region;

applying a third voltage to a third terminal to bias the multiplication region of the avalanche photo-transistor device, such that one or more additional charge carriers are generated from the one or more charge carriers within the multiplication region; and providing, by the avalanche photo-transistor device, the one or more additional charge carriers for a detection measurement, wherein applying the first voltage and applying the second voltage comprises applying a bias voltage difference between the first terminal and the second terminal of less than 3 volts.

14. The method of claim 13, wherein the incident light comprises one or more pulses of light traveling in a medium and being reflected from an object, and the detection measurement comprises identifying a time or a phase or a frequency delay due to a time-of-flight of the one or more pulses of light reflected from the object.

15. The method of claim 13, wherein the detection measurement is a current value corresponding to the additional charge carriers generated by the multiplication region.

16. The method of claim 13, wherein applying the second voltage and applying the third voltage comprises applying a bias voltage difference to achieve an avalanche process in the multiplication region.

17. The method of claim 13, wherein the first terminal is in electrical contact with a first doping region in the detection region of the avalanche photo-transistor device, and a first doping profile for the first doping region is at least $10^{16}$ cm$^{-3}$, wherein the third terminal is in electrical contact with a second doping region of the avalanche photo-transistor device, and a second doping profile for the second doping region is at least $10^{16}$ cm$^{-3}$, and wherein the interim doping region has a doping concentration greater than a threshold doping concentration at least $10^{16}$ cm$^{-3}$.

18. The method of claim 17, wherein the first doping region has a first type of dopant, the interim doping region has the first type of dopant, the second doping region has a second type of dopant, and the first type of dopant is different from the second type of dopant.

19. The method of claim 13, wherein a thickness of the multiplication region is between 100-500 nanometers.

20. The method of claim 13, wherein a material of the detection region comprises germanium.

* * * * *